United States Patent
Chu et al.

[11] Patent Number: 5,939,729
[45] Date of Patent: Aug. 17, 1999

[54] OPTICAL CONTROLLED RESONANT TUNNELING DIODE

[75] Inventors: Hye Yong Chu; Kyu-Suk Lee; Byueng-Su Yoo; Hyo-Hoon Park, all of Daejon-Shi, Rep. of Korea

[73] Assignee: Electronics and Telecommunications Research Institute, Taejon, Rep. of Korea

[21] Appl. No.: 08/976,776

[22] Filed: Nov. 24, 1997

[30] Foreign Application Priority Data

Jan. 16, 1997 [KR] Rep. of Korea ............ 97-1101

[51] Int. Cl.[6] .................................................. H01L 29/06
[52] U.S. Cl. .............................. 257/25; 257/21; 257/23; 257/24; 257/197
[58] Field of Search ................................ 257/14, 21, 22, 257/23, 24, 25, 184, 187, 197

[56] References Cited

U.S. PATENT DOCUMENTS 5,446,293  8/1995  Chu et al. ................................ 257/21
5,606,178  2/1997  Schulman et al. ....................... 257/25

Primary Examiner—Minh Loan Tran
Attorney, Agent, or Firm—Cohen, Pontani, Lieberman & Pavane

[57] ABSTRACT

The present invention relates to a semiconductor photoelectric device including a InAs layer formed to monoatomic thickness sandwiched between spacer layers adjacent to an emitter to maximize a difference in energy between two quantum states in accumulation layer of a resonant tunneling diode having a double barrier structure, resulting in separating the resonant tunneling current determined by two quantum states of the triangular well in accumulation layer of resonant tunneling diode, even when light of a low intensity is irradiated to the surface of the resonant tunneling diode. Thus, there is provided an optical controlled resonant tunneling diode, making it possible to manufacturing a switching device for controlling an electric signal using light source by adjusting, using light, the resonant tunneling determined by an excited state of the triangular well.

3 Claims, 4 Drawing Sheets

OPTICAL CONTROLLED RESONANT TUNNELING DIODE

FIELD OF THE INVENTION

The present invention relates to a semiconductor photoelectric device, and more particularly to an optical controlled resonant tunneling diode for controlling resonant tunneling characteristics, which is determined the current through the quantized state in a triangular quantum well formed in an accumulation layer by irradiating light to a top surface of the resonant tunneling diode having a double barrier structure.

BACKGROUND OF THE INVENTION

There have been studied much for a resonant tunneling photoelectric device with a double barrier structure, applying optical characteristics of a simple structure such as a double barrier structure to a high-speed electrical characteristics of resonant tunneling. An example includes U.S. Pat. No. 5,446,293 which discloses a resonant tunneling diode. When light is irradiated to a surface of the resonant tunneling diode, electrons and holes are produced and accumulated. The accumulation of electrons and holes induces a voltage drop in a double barrier structure of the diode to increase. Therefore, under light illumination to the surface of the diode, the condition for a resonant tunneling is satisfied at a lower supply voltage than at which light is not irradiated to the surface of the diode. The resonant tunneling condition is controlled by illuminating light to the surface of the diode, in which both a ground state in a quantum well and a Fermi-level of a contact layer correspond to each other.

SUMMARY OF THE INVENTION

The photo-excited carriers may be accumulated at the accumulation and the depletion layers, and thus the voltage drop increases. And, the triangular well is created. The non-resonant tunneling determined by the quantum states of the well serves to increase the resonant tunneling current.

It is therefore an object of the present invention to provide an optical controlled resonant tunneling diode, in which a resonant tunneling, which is determined by an excited state of a triangular well, is controlled by light using the phenomenon mentioned above.

To achieve the object, there is provided a optical controlled resonant tunneling diode in accordance with the present invention, comprising a buffer layer formed on a surface of a semi-insulating substrate; a first and a second spacer layers formed on a surface of the buffer layer in order; an asymmetric double barrier layer formed on a surface of the second spacer layer; a third spacer, a quantum well and a forth spacer layers on a surface of the asymmetric barrier layer in order; a fifth spacer and a contact layers formed a surface of the forth spacer layer in order; an emitter formed on a selected area of a surface of the contact layer; and a collector formed on a selected area of a surface of the buffer layer, wherein electric characteristics of a resonant tunneling determined by an excited state of a triangular well formed in the third spacer layer, a monoatomic quantum well layer, and the forth spacer layer is controlled by light source.

The present invention has a InAs well layer grown between spacer layers adjacent to an emitter, the InAs layer having the same thickness as that of a monoatomic layer. The InAs well layer makes a ground state to be transited toward a bottom of the well without positional movement of the triangular well, resulting in a maximum energy difference in two states. Making a photoelectric device using such a structure may achieve a divided resonant tunneling current generated by two quantum states even in a small intensity of light. When the diode is not irradiated by light, an electron density in an excited state of the triangular quantum well is low relative to a ground state, to thereby minimizing a resonant tunneling current. That is, a resonant tunneling peak through the ground state is obtained in a narrow voltage period, and therefore a non-resonant tunneling current can be reduced, making possible to manufacture a photoelectric device of a low noise.

BRIEF DESCRIPTION OF THE DRAWINGS

The present invention will be more clearly understood from the description as set forth below, with reference to the accompanying drawings, wherein.

Similar reference characters refer to similar parts in the several views of the drawings.

DESCRIPTION OF THE PREFERRED EMBODIMENT

Figure 1A:
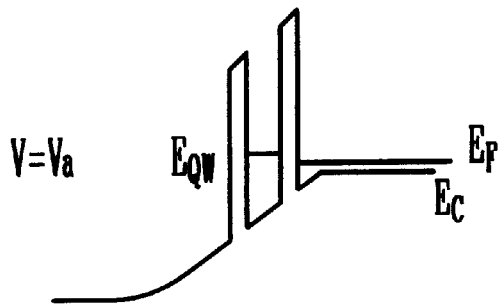
FIGS. 1a to 1c are views illustrating respective energy band. diagrams of a conventional resonant tunneling diode with undored spacer layers at the applied voltage(V).
Figure 1B:
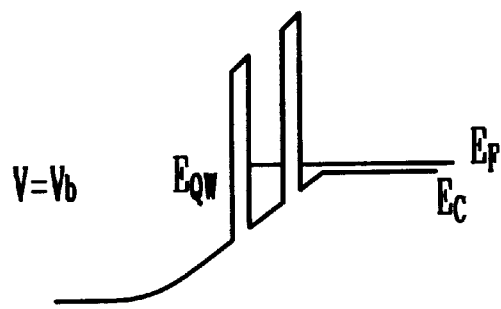
Figure 1C:
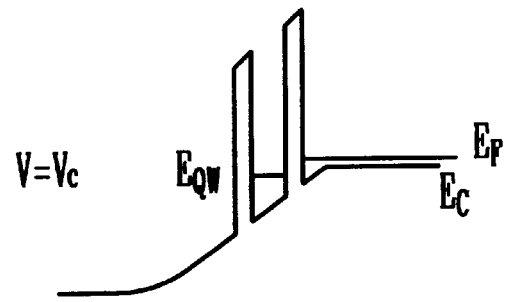
Figure 1D:
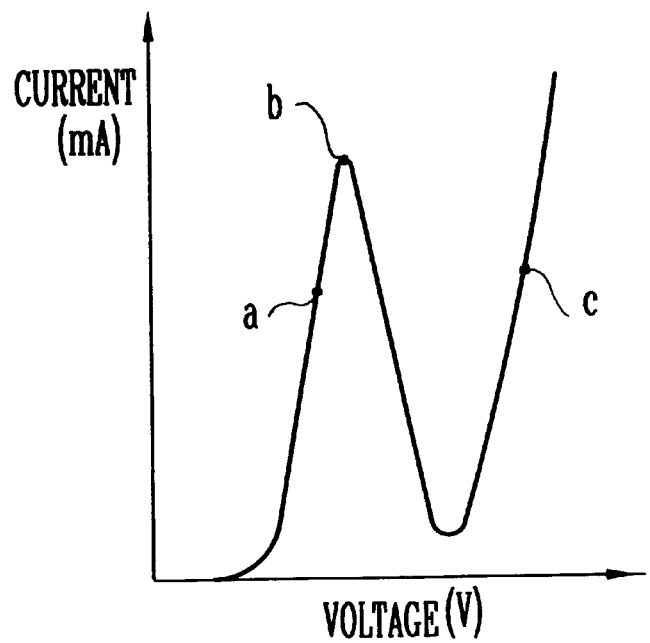
FIG. 1d is a graph illustrating current-voltage curves of a conventional resonant tunneling diode with spacer layers not doped.

FIGS. 1a to 1c are views illustrating respective energy bands of a conventional resonant tunneling diode with spacer layers not doped. FIG. 1d is a graph illustrating current-voltage curves. of the conventional resonant tunneling diode with spacer layers not doped. When a external voltage(V=$V_b$) is applied across the resonant tunneling diode, a Fermi-level $E_F$ may be aligned with a quantum state level $E_{QW}$ of a quantum well to generate a resonant tunneling current. Although the triangular quantum well is formed in the accumulation layer by applying the external voltage to the resonant tunneling diode with the spacer layer not doped, as shown in FIGS. 1a to 1c, it does not affect the current-voltage characteristics shown in FIG. 1d because the well is shallow.

Figure 2A:
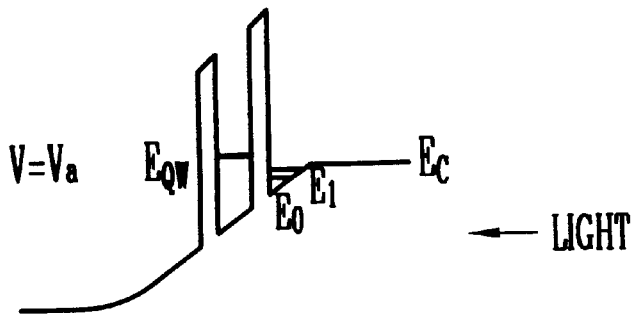
FIGS. 2a to 2e are views illustrating respective energy band diagrams of a conventional resonant tunneling diode with undoped-spacer layers under the laser illumination.

FIGS. 2a to 2e are views illustrating respective energy band diagrams of the conventional resonant tunneling diode with spacer layers not doped, wherein the diode is illuminated by light. FIG. 2f is a graph illustrating a comparison of current-voltage curves before and during light is illuminated to a surface of the conventional resonant tunneling diode having the spacer layer not doped. As shown in FIG. 2a, when the surface of the resonant tunneling diode is illuminated by light, photo-excited electrons and holes are accumulated in respective accumulation and depletion layers, thereby increasing a voltage drop in the clouble barrier structure of the diode. Therefore, the triangular quantum well is formed deep enough to generate discrete quantized-states $E_0$, $E_1$, as shown in FIGS. 2a to 2e.

Figure 2B:
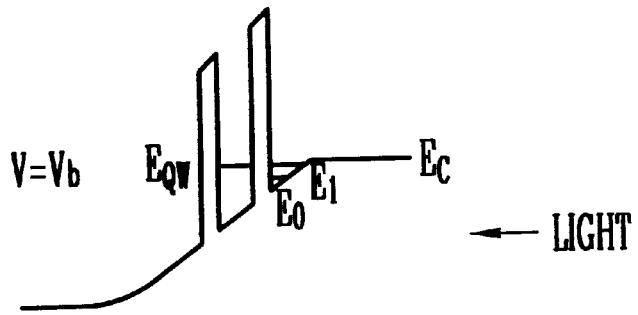
Figure 2C:
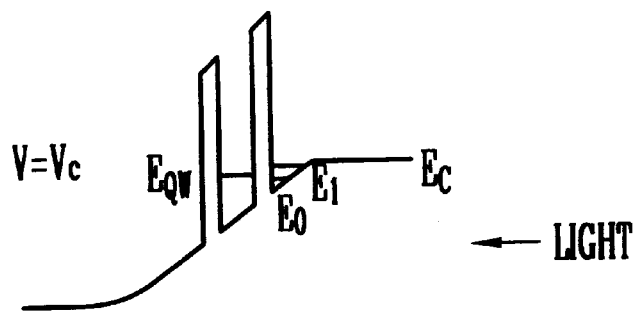
Figure 2D:
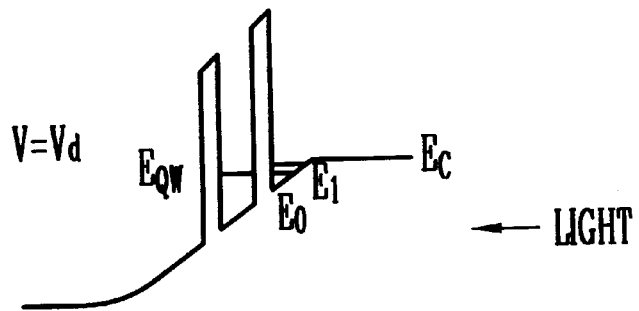
Figure 2E:
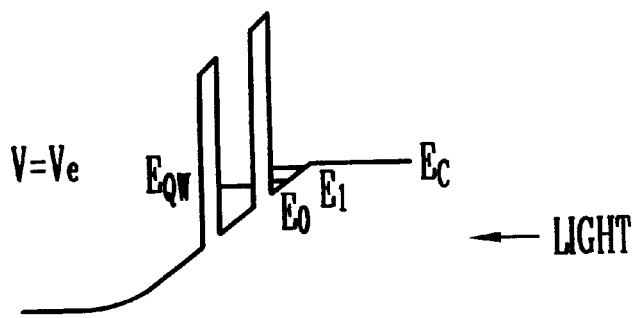
Figure 2F:
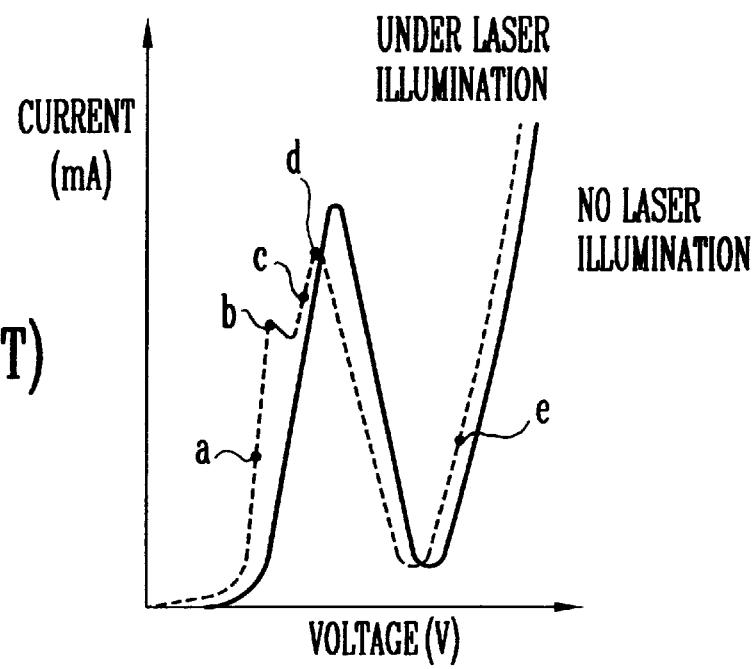
FIG. 2f is a graph illustrating a comparison of current-voltage characteristics before and during light is illuminated to a surface of a conventional resonant tunneling diode with undoped-spacer layers.

In FIG. 2b, when the external voltage (V=$V_b$) applred on the diode, there is an alignment of a ground state $E_{QW}$ of the quantum well with an excited state $E_1$ in the triangular quantum well, and there is provided a peak characteristics which corresponds to a point b in the current-voltage characteristics curve shown in FIG. 2f.

In FIG. 2c, when the external voltage (V=$V_c$) applied, an excited state $E_1$ is over a ground state $E_{QW}$, and a ground state $E_0$ is below the ground state $E_{QW}$. The tunneling current corresponds to a point c of current-voltage characteristics as shown in 2f.

In FIG. 2d, an external voltage (V=$V_d$)is applied across the diode to thereby align a ground state $E_{QW}$ of the quantum well with an ground state $E_1$ of the triangular quantum well. The tunneling current corresponds to a point d, as shown in FIG. 2f. In such a structure, the ground state $E_0$ and the excited state $E_1$ within the triangular quantum well are close each other, and therefore when the light illuminated to the surface of the diode is faint, the resonant tunneling currents determined by the respective states are appeared to be superimposed each other. In particular, even when the intensity of the light is increased, the ground and the excited states are separated each other as shown in FIG. 2d, but are still kept close each other.

FIG. 2e illustrates an energy band of the resonant tunneling diode, wherein a more increased voltage (V=$V_e$)is applied across the diode to thereby get the ground state $E_0$ and the excited state $E_1$ of the triangular quantum well, which are higher than the energy state $E_{QW}$ of the quantum well. The resonant tunneling corresponds to a point e as shown in FIG. 2.

Figure 3:
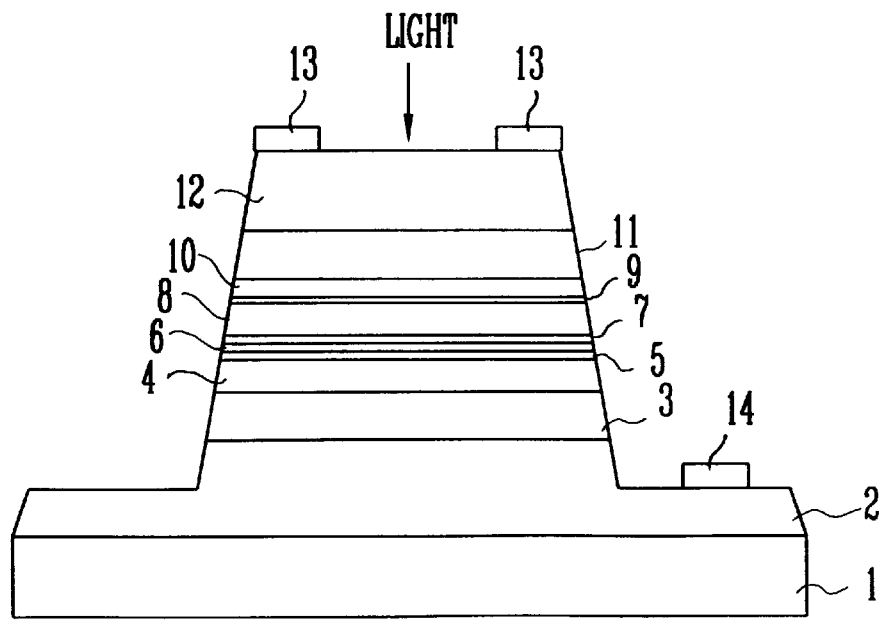
FIG. 3 is a cross-sectional view of an optical controlled resonant tunneling diode in accordance with the present invention.

FIG. 3 is a cross-sectional view of an optical controlled resonant tunneling diode in accordance with the present invention, wherein a monoatomic InAs well layer is sandwiched between spacer layers not doped. The resonant tunneling diode has a semi-insulating GaAs substrate 1. A n-type GaAs buffer layer 2 doped $10^{18}$cm$^{-3}$ or more is grown to 1 nm thickness on a surface of the substrate 1.

Then, a two-step spacer layer is grown on a surface of the GaAs buffer layer 2. The two-step spacer serves to prevent an impurity from diffusing, increase the length of a depletion layer, and enhance an effect of a voltage drop created by accumulating photo-excited carriers in a formed triangular quantum well of the accumulation layer. The two step spacer layer includes a first n-type GaAs spacer 3 formed to 100 nm thickness on a surface of the buffer layer 2, the spacer 3 doped $10^{17}$ cm$^{-3}$, and a second GaAs spacer 4 formed to 20 nm thickness on a surface of the spacer 3, the spacer 4 not doped.

Next, an asymmetric double barrier structure is grown on the GaAs spacer 4, which is comprised of a first AlAs barrier 5 formed to 5 nm thickness on a surface of the spacer 4, a GaAs well layer 6 formed to 4.5 nm thickness on a surface of the barrier 5, and a second AlAs barrier 7 to 4 nm thickness on the layer 6, each not doped.

An third GaAs spacer 8, a monoatomic InAs well layer 9 and a forth GaAs spacer 10 is grown on a surface of the barrier 7 in order, the third GaAs spacer 8 formed to 7 to 8 nm thickness on a surface of the barrier 7, an InAs well layer 9 formed on a surface of the spacer 8, and a forth GaAs spacer 10 formed to 2 nm thickness on a surface of the layer 9 each not doped. The InAs well layer 9 serves to enlarge the difference in energy band of two quantum states, i.e., an excited state and a ground state by transiting the ground state $E_0$ toward the conductive band, without affecting the position of the excited state.

An fifth GaAs spacer 11 is grown to 100 nm thickness on a surface of the forth spacer 10, which is doped $10^{17}$cm$^{-3}$. An n-type $Al_{0.1}Ga_{0.9}As$ contact layer 12 is grown to 500 nm thick on a surface of the fifth spacer 11, and is doped $10^{18}$cm$^{-3}$, serving to prevent an incident light from absorbing. An emitter 13 is formed on a selected area of a surface of the contact layer 12, and a collector 14 formed on a selected area of a surface of the GaAs buffer layer 2.

Figure 4A:
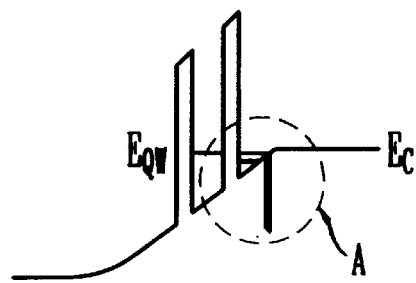
FIGS. 4a and 4b are views illustrating respective energy band diagrams of an optical controlled resonant tunneling diode having an InAs quantum well layer sandwiched between two spacer layers in accordance with the present invention.
Figure 4B:
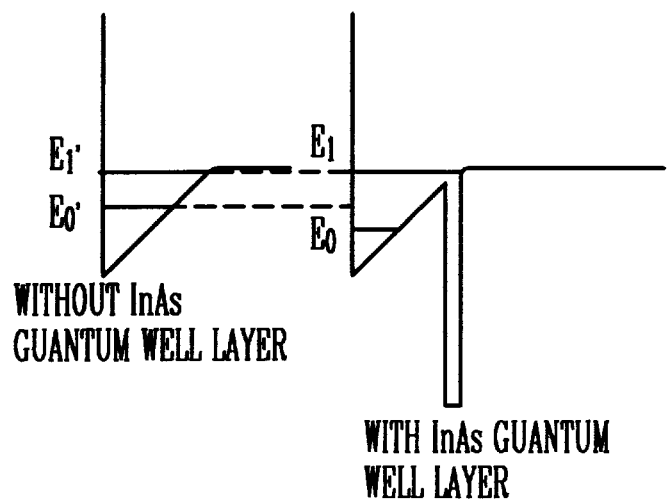

FIG. 4a is a view illustrating an energy band of an optical controlled resonant tunneling diode having the InAs well layer 9 between the third and the forth spacers 8 and 10. FIG. 4b is an energy band view illustrating a comparison with FIG. 2b, having an enlarged portion for A of FIG. 4a. The InAs quantum well layer is sandwiched to a monoatomic layer thickness between two spacer layers adjacent to the emitter. The InAs well layer makes a ground state to transit toward a bottom of the well without a positional movement of the triangular well, resulting in a maximum energy difference in these states.

Figure 4C:
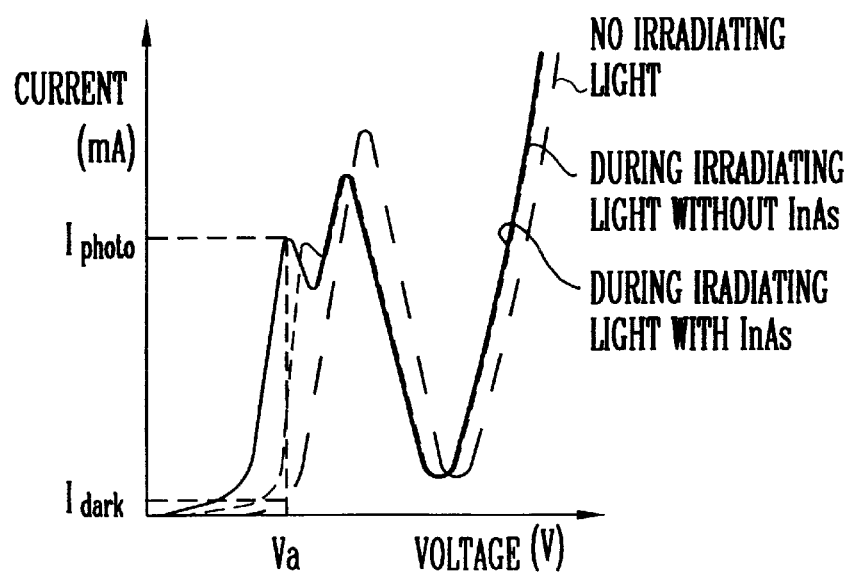
FIG. 4c is a graph illustrating a comparison of current-voltage curves in the present and the conventional optical controlled resonant tunneling diodes.

FIG. 4c is a graph illustrating a comparison of current-voltage characteristics in the present and the conventional optical controlled resonant tunneling diodes.

In case of manufacturing a photoelectric device using the structure proposed according to the present invention, a minimized resonant tunneling current is obtained because an electron density of the excited state is smaller than that of the ground state in the triangular quantum well before irradiating light. Accordingly, the resonant tunneling peak may be obtained within narrow period of voltage. That is, a non-resonant tunneling current may be obtained with a very low value. If light is irradiated to a surface of a resonant tunneling device having such a characteristics, it may separate the resonant tunneling current determined by two quantum states, even though the light is of a low intensity. That is, the current of $I_{photo}$ in the resonant tunneling diode is generated, when a light is irradiated to a surface of the diode in a situation in which a low current of $I_A$ has been generating in the diode by applying a predetermined voltage of $V_a$ across the diode, and therefore it is possible to manufacture a switching device for controlling a resonant tunneling signal having a high transmission speed, in which a lower noise is generated.

As described above, according to the present invention, by separating the resonant tunneling current determined by two quantum states of the triangular well in resonant tunneling diode, even when light of weak intensity is irradiated to the surface of the resonant tunneling diode, the resonant tunneling determined by an excited state of the triangular well can be controlled by the light, making it possible to manufacturing a switching device for controlling an electric signal using light source. The exemplary and preferred embodiment described herein is merely illustrative of the invention and do not limit the scope of the present invention.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A optical controlled resonant tunneling diode comprising:

a buffer layer formed on a surface of a semi-insulating substrate;

a first spacer layer formed on a surface of said buffer layer;

a second spacer layer formed on said first spacer layer;

an asymmetric double barrier layer formed on a surface of said second spacer layer;

a third spacer layer formed on a surface of said asymmetric double barrier layer;

a monoatomic quantum well layer formed on said third spacer layer;

a fourth spacer layer formed on said monoatomic quantum well layer;

a fifth spacer layer formed on a surface of said forth spacer layer;

a contact layer formed on said fifth spacer layer;

an emitter formed on a selected area of a surface of said contact layer; and a collector formed on a selected area of a surface of said buffer layer, wherein resonant tunneling characteristics are determined by an excited state of a triangular well formed in said third spacer layer, said monoatomic quantum well layer, and said forth spacer layer, the excited state of the triangular well being controlled by a laser.

2. The optical controlled resonant tunneling diode of claim 1, wherein said third spacer layer comprises a thickness in the range 7 to 8 nm, thereby minimizing a ground state energy of said triangular well.

3. The optical controlled resonant tunneling diode as set forth in claim 1, wherein said monoatomic quantum well layer comprises undoped InAs, thereby minimizing a ground state energy of said triangular well.

* * * * *